(12) United States Patent
Im et al.

(10) Patent No.: US 12,200,988 B2
(45) Date of Patent: Jan. 14, 2025

(54) DISPLAY APPARATUS COMPRISING A FIRST COMMON POWER LINE AND A SECOND COMMON POWER LINE CONNECTED WITH A FIRST ELECTRODE

(71) Applicant: LG Display Co., Ltd., Seoul (KR)

(72) Inventors: Jonghyeok Im, Paju-si (KR); Sul Lee, Paju-si (KR); Hyoung-Su Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 478 days.

(21) Appl. No.: 17/536,934

(22) Filed: Nov. 29, 2021

(65) Prior Publication Data

US 2022/0208934 A1 Jun. 30, 2022

(30) Foreign Application Priority Data

Dec. 31, 2020 (KR) .................. 10-2020-0189674

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC ..... G09G 2300/0426; G09G 2330/021; G09G 2330/02; G09G 2330/00; G09G 3/3233; G09G 2320/0204; G09G 2320/0223; G09G 2320/0233; G09G 3/3291; G09G 3/3266; G09G 2310/02841; H10K 59/131; H10K 59/1315
See application file for complete search history.

(56) References Cited

U.S. PATENT DOCUMENTS

| 7,522,133 | B2 * | 4/2009 | Kwak | H10K 59/131 345/82 |
| 10,840,321 | B2 * | 11/2020 | Song | H10K 59/1315 |
| 11,545,076 | B2 * | 1/2023 | Aoki | G09G 3/32 |
| 2003/0085405 | A1 * | 5/2003 | Park | H10K 59/131 257/72 |
| 2004/0108978 | A1 * | 6/2004 | Matsueda | H10K 59/131 345/76 |
| 2005/0012694 | A1 * | 1/2005 | Park | H10K 59/131 257/E27.111 |
| 2005/0023956 | A1 * | 2/2005 | Kwak | H10K 59/131 313/497 |
| 2005/0186839 | A1 * | 8/2005 | Matsueda | H10K 50/824 439/577 |

(Continued)

FOREIGN PATENT DOCUMENTS

KR 10-2020-0072956 A 6/2020

*Primary Examiner* — Sophia T Nguyen
(74) *Attorney, Agent, or Firm* — Fenwick & West LLP

(57) ABSTRACT

Disclosed is a display apparatus capable of reducing a voltage drop of a common electrode and improving a transmittance. The display apparatus comprises a substrate including a display area having a first area and a second area, a first electrode disposed on the substrate and configured to cover the first area and the second area, a first common power line disposed between the substrate and the first electrode and connected to the first electrode provided in the first area, and a second common power line connected to the first electrode provided in the second area through the first area.

20 Claims, 5 Drawing Sheets

(56) References Cited

U.S. PATENT DOCUMENTS

| | | | |
|---|---|---|---|
| 2007/0077848 A1* | 4/2007 | Koo | H10K 59/131 445/24 |
| 2008/0230770 A1* | 9/2008 | Yoon | H10K 59/1216 257/E51.026 |
| 2008/0246026 A1* | 10/2008 | Kim | H10K 59/1216 257/E27.113 |
| 2009/0115708 A1* | 5/2009 | Sagawa | H10K 59/131 345/55 |
| 2010/0244664 A1* | 9/2010 | Fujioka | H05B 33/10 445/24 |
| 2011/0012816 A1* | 1/2011 | Kang | H10K 59/121 345/76 |
| 2011/0157122 A1* | 6/2011 | Tsai | H10K 59/1315 345/80 |
| 2012/0104401 A1* | 5/2012 | Kubota | H01L 27/1255 257/E33.053 |
| 2012/0306841 A1* | 12/2012 | Toya | G09G 3/3225 345/212 |
| 2013/0056784 A1* | 3/2013 | Lee | H10K 59/1315 438/22 |
| 2014/0183479 A1* | 7/2014 | Park | H10K 59/1315 438/34 |
| 2014/0353616 A1* | 12/2014 | Park | H10K 59/131 438/34 |
| 2014/0374732 A1* | 12/2014 | Jeong | H10K 50/824 438/34 |
| 2015/0048322 A1* | 2/2015 | So | H10K 59/122 257/40 |
| 2015/0054811 A1* | 2/2015 | Azizi | G06F 1/3218 345/211 |
| 2015/0228223 A1* | 8/2015 | Park | H10K 59/353 345/77 |
| 2015/0279271 A1* | 10/2015 | Xi | H10K 59/131 345/76 |
| 2015/0357383 A1* | 12/2015 | Chung | H10K 59/179 257/40 |
| 2016/0013438 A1* | 1/2016 | Im | H10K 59/1315 257/762 |
| 2016/0035813 A1* | 2/2016 | Lee | H10K 59/1315 438/23 |
| 2016/0204171 A1* | 7/2016 | Lee | H10K 59/122 438/34 |
| 2017/0053591 A1* | 2/2017 | Seo | G09G 3/3225 |
| 2018/0137821 A1* | 5/2018 | Azizi | G06F 1/3265 |
| 2018/0197932 A1* | 7/2018 | Ho | H01L 27/124 |
| 2019/0019444 A1* | 1/2019 | Jo | H10K 59/122 |
| 2019/0207156 A1* | 7/2019 | Gil | H10K 50/844 |
| 2019/0237494 A1* | 8/2019 | Bae | H10K 50/81 |
| 2019/0385531 A1* | 12/2019 | Jin | G09G 3/3208 |
| 2020/0119126 A1* | 4/2020 | Jo | H10K 59/1315 |
| 2020/0194529 A1* | 6/2020 | Lee | H01L 28/60 |
| 2020/0203469 A1* | 6/2020 | Li | H10K 59/1315 |
| 2020/0286426 A1* | 9/2020 | Li | G09G 3/3233 |
| 2020/0403059 A1* | 12/2020 | Oh | H10K 59/1213 |
| 2021/0109636 A1* | 4/2021 | Lius | G06F 3/0412 |
| 2021/0118969 A1* | 4/2021 | Kim | H10K 71/00 |
| 2021/0126081 A1* | 4/2021 | Moon | H10K 59/131 |
| 2021/0193688 A1* | 6/2021 | Shin | H10K 50/824 |
| 2021/0351248 A1* | 11/2021 | Lee | H10K 59/122 |
| 2023/0185392 A1* | 6/2023 | Im | G06F 3/0416 345/174 |
| 2023/0252945 A1* | 8/2023 | Yao | G09G 3/3233 345/204 |

* cited by examiner

DISPLAY APPARATUS COMPRISING A FIRST COMMON POWER LINE AND A SECOND COMMON POWER LINE CONNECTED WITH A FIRST ELECTRODE

CROSS-REFERENCE TO RELATED APPLICATIONS

This application claims the benefit of Republic of Korea Patent Application No. 10-2020-0189674 filed on Dec. 31, 2020, which is hereby incorporated by reference in its entirety.

BACKGROUND

Field of Technology

The present disclosure relates to a display apparatus.

Discussion of the Related Art

With the advancement of an information-oriented society, attention and requirements for a display apparatus configured to display information have been increased in various types. Recently, various display apparatuses such as a liquid crystal display apparatus, an organic light emitting display apparatus such as a plasma display apparatus, an organic light emitting display apparatus, and an electroluminescent display apparatus such as a quantum dot light emitting display apparatus have been utilized.

Among the display apparatuses, the organic light emitting display apparatus and the quantum dot light emitting display apparatus are self-emissive apparatuses, and may be fabricated at a lightweight and slim size as it does not need a separate light source unlike a liquid crystal display apparatus. Also, the organic light emitting display apparatus and the quantum dot light emitting display apparatus are favorable in view of power consumption, and also are excellent for a viewing angle and a contrast ratio. Recently, research has been actively conducted on a display apparatus capable of viewing an object or an image on the opposite side by using a transmission area in an organic light emitting display apparatus.

On the other hand, the display apparatus may be provided in a top emission type or a bottom emission type according to a transmission direction of light emitted. The bottom emission type has high stability and process freedom, but has a limitation on an aperture ratio so that research on the top emission type having the high aperture ratio has recently been actively performed.

In case of the display apparatus with the top emission type, a light emitting layer disposed between a pixel electrode and a common electrode is applied with a voltage by the pixel electrode and the common electrode, and is then operated. At this time, since the light emitted from the light emitting layer has to pass through the common electrode, the common electrode is formed at a thin thickness to have a transparent metal or a semi-transmissive property. However, when the common electrode is thinly formed, a resistance is increased so that a voltage drop is generated due to a distance difference between a portion close to a voltage supply and a portion distant from a voltage supply. In order to solve this problem, a method for lowering a surface resistance by a connection of an auxiliary electrode to the common electrode is used, however, this auxiliary electrode might cause lowering of transparency by reducing the transmission area in the display apparatus.

SUMMARY

The present disclosure has been made in view of the above problems, and it is an object of the present disclosure to provide a display apparatus capable of preventing or at least reducing a voltage drop of a common electrode and improving a transmittance.

In accordance with an aspect of the present disclosure, the above and other objects can be accomplished by the provision of a display apparatus comprising a substrate including a display area having a first area and a second area, a first electrode provided in the first area and the second area, a first common power line disposed between the substrate and the first electrode and connected to the first electrode provided in the first area, and a second common power line disposed between the substrate and the first electrode and connected to the first electrode provided in the second area through the first area.

In accordance with another aspect of the present disclosure, there is provided a display apparatus comprising a substrate including a display area having a first area and a second area, wherein each of the first area and the second area includes a transmission area, a first electrode provided in the first area and the second area, a first common power line connected with the first electrode provided in the first area, and a second common power line connected with the first electrode provided in the second area, wherein a length of the first common power line is different from a length of the second common power line.

The first common power line and the second common power line are respectively connected with the first electrode located in the first area and the first electrode located in the second area of the display area according to the present disclosure so that it is possible to supply the voltage through the first common power line and the second common power line, thereby reducing a width in the first common power line and the second common power line, and thus improving a transmittance.

In the lower portion and upper portion of the display area according to the present disclosure, the common power voltage is applied toward the central portion of the display area so that it is possible to reduce a bezel width.

According as the first common power line and the second common power line are respectively connected with the first electrode located in the first area and the first electrode located in the second area of the display area according to the present disclosure so that it is possible to reduce a width of the first common power line and the second common power line, thereby improving a transmittance and preventing or at least reducing a voltage drop (IR drop) without a common voltage rise (Vss rising).

Detailed description of the various examples of the present disclosure other than solving means of the problem mentioned above are included in the following description and the drawings.

BRIEF DESCRIPTION OF THE DRAWINGS

The above and other objects, features and other advantages of the present disclosure will be more clearly understood from the following detailed description taken in conjunction with the accompanying drawings. In the drawings.

DETAILED DESCRIPTION

Figure 1:
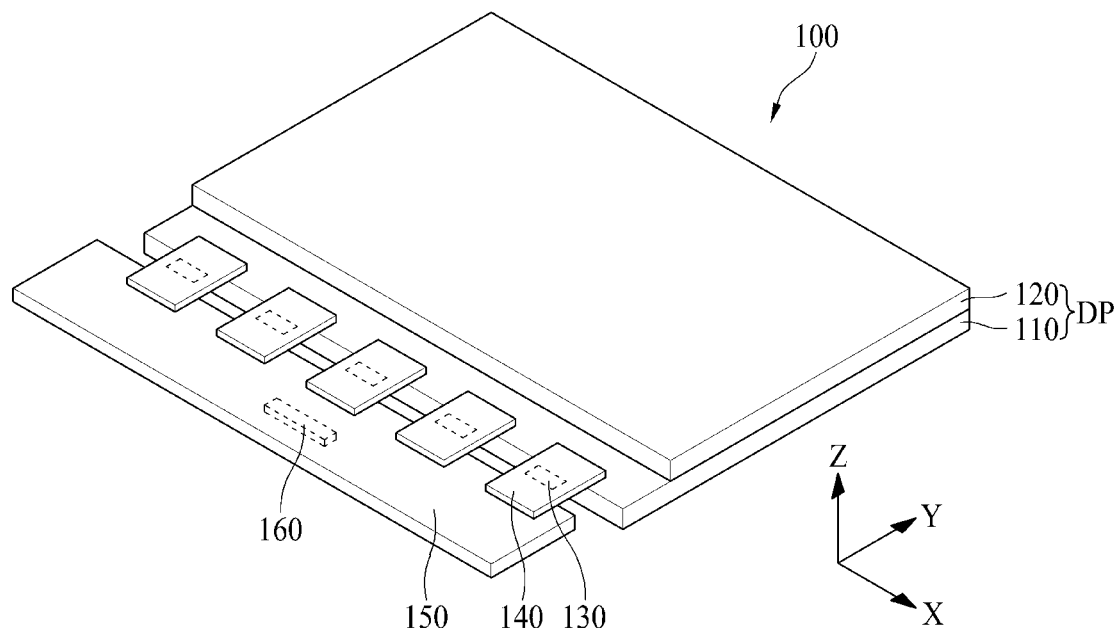
FIG. 1 is a perspective view illustrating a display apparatus according to one embodiment of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by the scopes of the appended claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present disclosure are used, another part can be added unless 'only-' is used. The terms of a singular form can include plural forms unless referred to the contrary.

In describing a positional relationship, for example, when a position relation between two parts is described as 'on-', 'over-', 'under-', and 'next-', one or more other parts can be disposed between the two parts unless 'just' or 'direct' is used.

In describing a time relationship, for example, when the temporal order is described as 'after-', 'subsequent-', 'next-', and 'before-', a case which is not continuous can be included unless 'just' or 'direct' is used.

It will be understood that, although the terms "first," "second," and the like can be used herein to describe various elements, these elements should not be limited by these terms. These terms are only used to distinguish one element from another and may not define any order. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in a co-dependent relationship.

Hereinafter, embodiments of the present disclosure will be described in detail with reference to the accompanying drawings.

Figure 2:
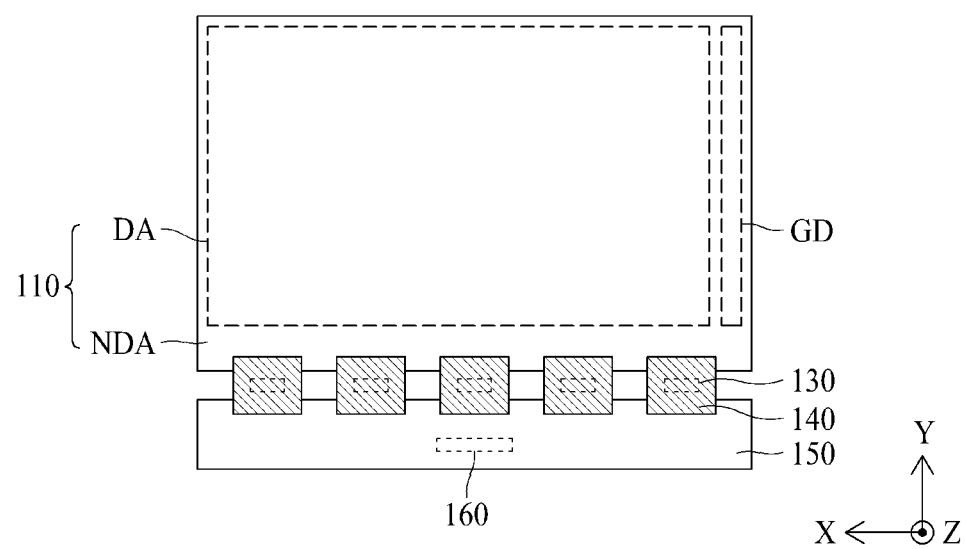
FIG. 2 is a plan view illustrating a first substrate, a source drive IC, a flexible film, a circuit board, and a timing controller of FIG. 1 according to one embodiment of the present disclosure.
Figure 3:
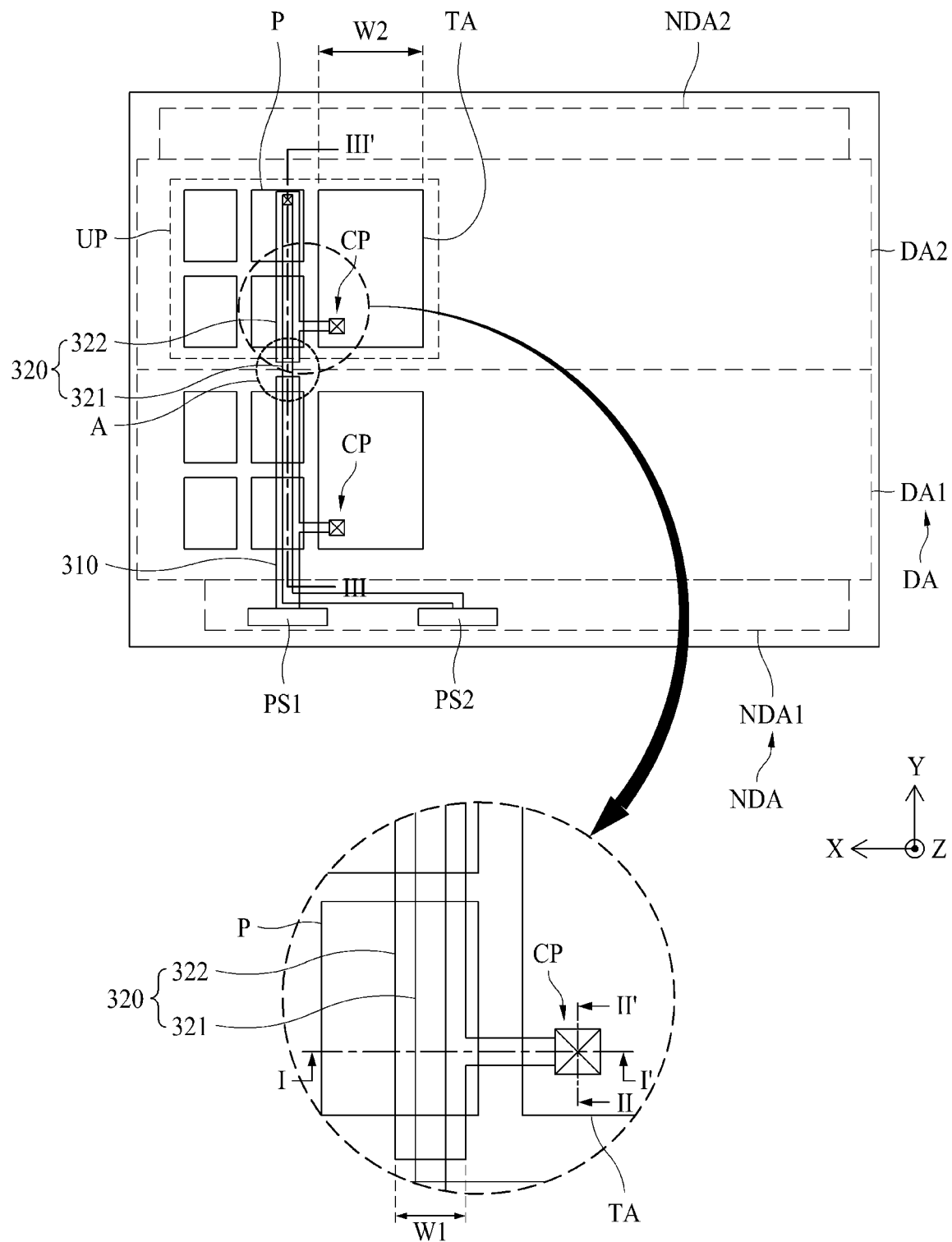
FIG. 3 is a plan view schematically illustrating the first substrate according to one embodiment of the present disclosure.

FIG. 1 is a perspective view illustrating a display apparatus according to one embodiment of the present disclosure. FIG. 2 is a plan view illustrating a first substrate, a source drive IC, a flexible film, a circuit board, and a timing controller of FIG. 1 according to one embodiment of the present disclosure. FIG. 3 is a plan view schematically illustrating the first substrate according to one embodiment of the present disclosure. FIG. 3 shows only two unit pixels UP, however, a plurality of unit pixels UP may be provided in the X-axis direction and the Y-axis direction, and a first common power line 310 and a second common power line 320 may be provided to be overlapped with the plurality of unit pixels UP.

Referring to FIGS. 1 to 3, the X-axis represents a direction parallel to a gate line, the Y-axis represents a direction parallel to a data line, and the Z-axis represents a thickness direction of a display apparatus 100. However, the X axis represents a length direction of a long side of a display panel DP, and the Y axis may indicate a length direction of a short side of the display panel DP.

The display apparatus 100 according to one embodiment of the present disclosure is implemented as an organic light emitting display (OLED), and may be implemented as a liquid crystal display (LCD), a plasma display panel (PDP), a quantum dot light emitting diode (quantum dot light emitting diode), or an electrophoresis display.

Referring to FIGS. 1 to 3, the display apparatus 100 according to one embodiment of the present disclosure includes a display panel DP, a gate driver GD, a source drive integrated circuit (hereinafter, referred to as 'IC') 130, a flexible film 140, a circuit board 150, and a timing controller 160.

The display panel DP includes a first substrate 110 and a second substrate 120. The second substrate 120 may be an encapsulation substrate. The first substrate 110 may be a plastic film or a glass substrate. The second substrate 120 may be a plastic film, a glass substrate, or an encapsulation film. The first substrate 110 and the second substrate 120 may be made of a transparent material. The first substrate 110 and the second substrate 120 may be bonded to each other to form the transparent display panel DP.

Various components disposed on the first substrate 110 will be roughly described below with reference to FIGS. 6 and 8. For example, various components disposed on the first substrate 110 may include a first layer 111 provided on an upper surface of the first substrate 110, a thin film transistor 112 disposed on the first layer 111, a second layer 113 provided on the first layer 111 and configured to cover the thin film transistor 112, a plurality of pixels P provided on the second layer 113, and a transmission area TA provided between each of the plurality of pixels P.

Each of the plurality of pixels P may include a first electrode 210, an organic light emitting layer 220, and a second electrode 230. Herein, the first electrode 210 may be a negative or cathode electrode, and the second electrode 230 may be a positive or anode electrode.

Meanwhile, a first common power line 310 and a second common power line 320 connected to the first electrode 210 may be provided on the first substrate 110. As shown in FIG. 3, the first common power line 310 may be connected to the first electrode 210 located in a first area DA1 of a display area DA, and the second common power line 320 may be connected to the first electrode 210 located in a second area DA2 of the display area DA. The second common power line 320 may be connected to the first electrode 210 located in the second area DA2 through the first area DA1.

In order to supply a voltage to each of the first electrode 210 located in the first area DA1 and the first electrode 210 located in the second area DA2, the first common power line 310 and the second common power line 320 may be disposed on different layers in the first area DA1.

The first common power line 310 and the second common power line 320 are spaced apart from each other, and at least a portion of the second common power line 320 may overlap with the first common power line 310 in the thickness direction of the first substrate 110.

More specifically, the first common power line 310 may be disposed on an upper surface of the first layer 111. The second common power line 320 may include a first sub common power line 321 and a second sub common power line 322, wherein the first sub common power line 321 may be disposed on the upper surface of the first substrate 110 and may be configured to be partially overlapped with the first common power line 310, and the second sub common power line 322 may be spaced apart from the first common power line 310 on the upper surface of the first layer 111 while being positioned to be higher than the first sub common power line 322, and may be connected to the first sub common power line 321. Therefore, the first common power line 310 and the second common power line 320 may be spaced apart from each other without being in contact with each other. As a result, the first common power line 310 may be a single wire, and the second common power line 320 may be a double wire provided on different layers and electrically connected to each other. This will be described below with reference to FIGS. 6 and 8.

The gate lines, the data lines, and the plurality of pixels P are formed on one surface of the first substrate 110 confronting the second substrate 120. The pixels P are formed in an area defined by the crossing structure of the gate lines and the data lines.

Meanwhile, each of the plurality of pixels P may be one of a red pixel for emitting red light, a green pixel for emitting green light, a blue pixel for emitting blue light, and a white pixel for emitting white light. The plurality of pixels P may constitute one unit pixel UP.

As described above, the unit pixel UP may include a red pixel P, a green pixel P, a blue pixel P, and a white pixel P, but may further include other color pixels in addition to the pixels, and any one of the pixels may be omitted. Also, the arrangement order of the plurality of pixels P included in the unit pixel UP may be variously changed.

On the other hand, the display apparatus 100 according to one embodiment the present disclosure may further include a transmission area TA adjacent to the plurality of pixels P, as well as a plurality of pixels P. Accordingly, the display apparatus 100 according to one embodiment of the present disclosure can be provided to see objects or images located behind the display panel DP through the transmission area TA.

Each of the pixels P may include a light emitting device having a thin film transistor, a first electrode, a light emitting layer, and a second electrode. Each of the pixels P supplies a predetermined current to the organic light emitting device according to a data voltage of the data line when a gate signal is inputted from the gate line using the thin film transistor. Accordingly, each of the light emitting devices of the pixels can emit light with a predetermined luminance according to a predetermined current.

The display panel DP may be divided into a display area DA for displaying an image by forming pixels P, and a non-display area NDA on which an image is not displayed. The gate lines, data lines, and pixels P may be formed in the display area DA. The gate driver GD and a pad portion may be formed in the non-display area NDA, and the pad portion (not shown) may be provided with a first voltage supply portion PS1 and a second voltage supply portion PS2. The pad portion may be provided in a first non-display area NDA1 of FIG. 3.

Each of the first common power line 310 and the second common power line 320 may have different lengths from the pad portion. This is because a voltage is supplied to the first electrode 210 provided in each of first and second areas DA1 and DA2 disposed at different positions.

Also, as shown in FIG. 3, the first common power line 310 and the second common power line 320 may overlap partially each other in the first area DA1. This is to broaden the size of the transmission area TA by overlapping partially the first common power line 310 and the second common power line 320 with each other, thereby improving a transmittance.

Meanwhile, the display apparatus 100 according to one embodiment of the present disclosure may include the display area DA including the first area DA1 and the second area DA2. As shown in FIG. 3, the first area DA1 may refer to the lower half of the display area DA and may refer to the display area DA disposed below with respect to the Y-axis direction. The second area DA2 may be the upper half of the display area DA and may refer to the display area DA disposed above with respect to the Y-axis direction. The first area DA1 may be the area closer to the first voltage supply portion PS1 and the second voltage supply portion PS2 in comparison to the second area DA2.

Herein, the Y-axis direction may be parallel to the data line. Accordingly, the first area DA1 and the second area DA2 may be disposed in the display area DA while being parallel to the data line, but not necessarily. The first area DA1 and the second area DA2 may be arranged in a horizontal direction with respect to the gate line. In this case, the first voltage supply portion PS1 and the second voltage supply portion PS2 may also be disposed in a horizontal direction with respect to the gate line.

The first area DA1 and the second area DA2 of the display apparatus 100 according to one embodiment of the present disclosure may be provided to reduce the reduction of luminance through the first voltage supply portion PS1, the second voltage supply portion PS2, the first common power line 310, and the second common power line 320 even when the distance from each of the first voltage supply portion PS1 and the second voltage supply portion PS2 is differently designed.

Meanwhile, in the display apparatus 100 according to one embodiment of the present disclosure, the display area DA is formed of the first area DA1 and the second area DA2. The reason for this is that the voltage (or common power voltage) is supplied to each of the first electrode 210 provided in the first area DA1 and the first electrode 210 provided in the second area DA2 through the first common power line 310 and the second common power line 320. Thus, the voltage may be individually (or independently) supplied to the first electrode 210 located in the first area DA1 and the second area DA2 of the display area DA so that it is possible to reduce the width of the first common power line 310 and the second common power line 320, thereby improving a transmittance and preventing a voltage drop (IR drop) without a common voltage rise (Vss rising).

That is, the display apparatus 100 according to one embodiment of the present disclosure can dividedly supply the voltage to the common electrode (or cathode electrode) located in different areas of the display area DA by using the plurality of common power lines so that it is possible to prevent the voltage drop of each of the common power lines. Thus, the higher voltage may be supplied to the first area DA1 and the second area DA2, to thereby improve a luminance of an image displayed in each of the first area DA1 and the second area DA2.

Figure 4:
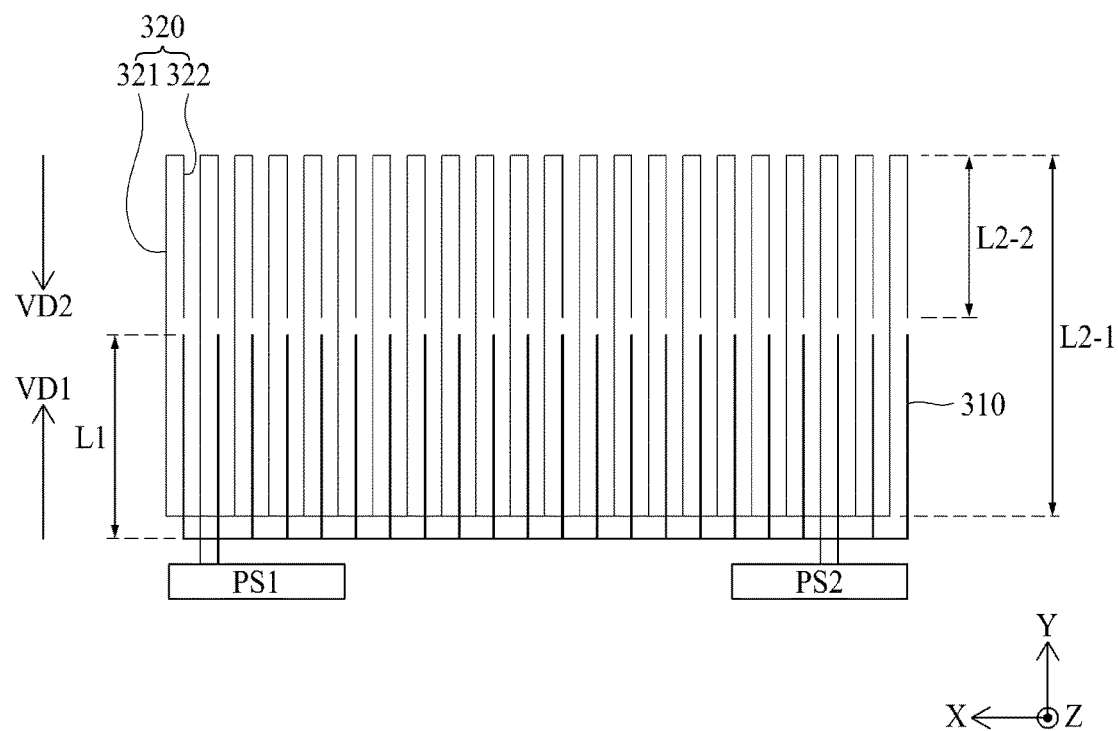
FIG. 4 schematically illustrates a first voltage supply portion, a second voltage supply portion, a first common power line, and a second common power line of FIG. 3 according to one embodiment of the present disclosure.

As shown in FIG. 4, the first common power line 310 and the second common power line 320 are connected to the first voltage supply portion PS1, and the first common power line 310 and the second common power line 320 are connected to the second voltage supply portion PS2, whereby the first common power line 310 and the second common power line 320 may be supplied with the same voltage or different voltages from the first voltage supply portion PS1 and the second voltage supply portion PS2.

The gate driver GD supplies gate signals to the gate lines according to the gate control signal input from the timing controller 160. The gate driver GD may be formed in a gate driver in panel (GIP) manner on the non-display area NDA at one side or both sides of the display area DA of the display panel DP. Alternatively, the gate driver GD may be manufactured as a driving chip to be mounted on the flexible film and may be attached to the non-display area NDA at one side of the display area DA of the display panel DP or the non-display area NDA outside the display area DA of the display panel DP in a tape automated bonding (TAB) manner.

The source drive IC 130 receives digital video data and source control signal from the timing controller 160. The source drive IC 130 converts the digital video data into analog data voltages according to the source control signal and supplies the analog data voltages to the data lines. When the source drive IC 130 is manufactured as a driving chip, the source drive IC 130 may be mounted on the flexible film 140 in a chip on film (COF) or a chip on plastic (COP) method.

In the non-display area NDA of the display panel DP, there are pads such as data pads, and the first and second voltage supply portions PS1 and PS2. The first voltage supply portion PS1 is connected to the first common power line 310 and is configured to supply the voltage (or common power voltage), and the second voltage supply portion PS2 is connected to the second common power line 320 and is configured to supply the voltage (or common power voltage).

As shown in FIG. 3, the non-display area NDA may include a first non-display area NDA1 adjacent to the first area DA1, and a second non-display area NDA2 disposed adjacent to the second area DA2. The first non-display area NDA1 may be disposed symmetrically with the second non-display area NDA2 based on the display area DA. Therefore, the first non-display area NDA1, the display area DA, and the second non-display area NDA2 may be arranged in a row along the Y-axis direction. The first voltage supply portion PS1 and the second voltage supply portion PS2 may be disposed in the first non-display area NDA1.

The first voltage supply portion PS1 may be connected to the first common power line 310 in the first non-display area NDA1. The second voltage supply portion PS2 is spaced apart from the first voltage supply portion PS1 in the first non-display area NDA1, and may be connected to the second common power line 320, and more particularly, to the first sub common power line 321 of the second common power line 320 in the first non-display area NDA1.

In the display apparatus 100 according to one embodiment of the present disclosure, according as the first common power line 310 and the second common power line 320, which are spaced apart from each other and are partially overlapped with each other, are respectively connected to the first electrode 210 provided in the first area DA1 and the first electrode 210 provided in the second area DA2, the common power voltage may be individually (or dividedly) supplied so that it is possible to reduce the width of the first common power line 310 and the second common power line 320, to thereby improve an aperture ratio of the transmission area TA, and thus improve a transmittance.

Also, in the display apparatus 100 according to one embodiment of the present disclosure, the common power voltage may be individually (or dividedly) supplied to the first electrode 210 located in the first area DA1 and the second area DA2 of the display area DA through the first common power line 310 and the second common power line 320, thereby preventing the voltage drop (IR drop) without the common voltage rise (Vss rising).

In FIGS. 3 and 4, there are one first voltage supply portion PS1 and one second voltage supply portion PS2. However, the plurality of the first voltage supply portions PS1 and the plurality of second voltage supply portion PS2 may be provided in the first non-display area NDA1, respectively, to supply the same common power voltage to the first common power line 310 and the second common power line 320, or supply the different common power voltages to the respective first common power line 310 and second common power line 320.

Wires connecting the pads and the source drive IC 130, and wires connecting the pads and the wirings of the circuit board 150 may be formed on the flexible film 140. The flexible film 140 is attached onto the pads by the use of anisotropic conducting film, thereby connecting the pads and the wirings of the flexible film 140.

The circuit board 150 may be attached to the flexible films 140. The circuit board 150 may be mounted with a plurality of circuits implemented as driving chips. For example, the timing controller 160 may be mounted on the circuit board 150. The circuit board 150 may be a printed circuit board or a flexible printed circuit board.

The timing controller 160 receives digital video data and timing signals from an external system board through a cable of the circuit board 150. The timing controller 160 generates the gate control signal for controlling the operation timing of the gate driver GD, and the source control signal for controlling the source drive ICs 130 based on the timing signal. The timing controller 160 supplies the gate control signal to the gate driver GD, and supplies the source control signal to the source drive ICs 130.

For the common electrode to cover both the first area DA1 and the second area DA2 in the display apparatus 100 according to one embodiment of the present disclosure, the first common voltage line 310 is connected to the first electrode 210 located in the first area DA1, and the second common voltage line 320 is connected to the first electrode 210 located in the second area DA2.

As described above, the display apparatus 100 according to one embodiment of the present disclosure may be provided to supply the different common power voltages to the first common power line 310 and the second common power line 320.

For example, when the different voltages are applied from the first voltage supply portion PS1 and the second voltage supply portion PS2 to the first electrode 210 located in the first area DA1 and the first electrode 210 located in the second area DA2, a luminance of the image displayed on the first area DA1 and the second area DA2 may vary.

In the display apparatus 100 according to one embodiment of the present disclosure, the different voltages may be respectively supplied to the first electrode 210 located in the first area DA1 and the first electrode 210 located in the second area DA2 through the first common voltage line 310 and the second common voltage line 320, so that a luminance uniformity may be improved by reducing a luminance deviation of the image displayed on the first area DA1 and the second area DA2.

On the other hand, as the length of the common power line (or the current path of the cathode voltage) applied from the voltage supply portion is longer, a common power voltage rise (Vss Rising) is generated. In this case, a luminance may be reduced due to a reduction of a voltage deviation from the anode electrode. For example, since the voltage supplied to the anode electrode is equal to 10V, the common power voltage is increased from 0V to 4V as the length of the common power line is longer, whereby the electric field difference between the cathode electrode (or common electrode) and the anode electrode in the organic light emitting layer disposed in the pixel is lowered to 6V from 10V, and thus a luminance of the organic light emitting layer which emits light in the pixel may be reduced. That is, as a distance from the voltage supply portion increases, a voltage drop (IR drop) occurs, thereby reducing a luminance of an image.

For example, as shown in FIG. 3, the common power voltage may be increased from the first area DA1 to the second area DA2 based on the plurality of pixels P arranged in the Y-axis direction, which will be seen through the following equation, $$\Delta V\_AA\text{-line}(V) = \left[\left(\frac{Y \times (Y+1)}{2}\right) \times R\_pxl \times I\_pxl\right].$$

In the above equation, 'ΔV_AA-Line(V)' denotes a common power voltage (or voltage deviation) of each of the plurality of pixels P disposed along the Y-axis direction, 'Y' denotes a pixel number from the first pixel of the first area DA1 adjacent to the first non-display area NDA1 to the last pixel (or outermost pixel) of the second area DA2 adjacent to the second non-display area NDA2 in the Y-axis direction, 'R_PXL' denotes a resistance of one pixel, and 'I_PXL' denotes a current of one pixel.

According to the above equation, the common power voltage V of the first pixel is RI, the common power voltage V of the second pixel is 3IR, and the common power voltage V of the third pixel is 6IR. That is, it can be seen that the common power voltage V increases from the first pixel to the third pixel. This may mean that the common power voltage is increased or the voltage drop occurs according to the increase of distance from the voltage supply portion. Therefore, the voltage deviation between the cathode electrode and the anode electrode may be reduced according to the increase of distance from the voltage supply portion, whereby a luminance may be reduced.

In the display apparatus 100 according to one embodiment of the present disclosure, the second voltage supply portion PS2 supplies the second voltage, which is relatively lower (or less) than the first voltage, to the first electrode 210 located in the second area DA2, which is positioned farther than the first area DA1, from the second voltage supply portion PS2 through the second common power line 320, and the first voltage supply portion PS1 supplies the first voltage, which is relatively higher than the second voltage, to the first electrode 210 located in the first area DA1, which is positioned closer to the first voltage supply portion PS1, through the first common power line 310 so that a luminance degradation of the second area DA2 is reduced, and a luminance of the first area DA1 is lowered, thereby reducing a luminance deviation between the first area DA1 and the second area DA2. Alternatively, the display apparatus 100 according to one embodiment of the present disclosure may be configured to maintain a luminance of the first area DA1, and further increase a luminance of the second area DA2 by adjusting the first voltage and the second voltage, thereby reducing the luminance deviation between the first area DA1 and the second area DA2.

Meanwhile, in the display apparatus 100 according to one embodiment of the present disclosure, each of the first common power line 310 and the second common power line 320 supplies the voltage to each of the first electrode 210 located in the first area DA1 and the first electrode 210 located in the second area DA2. Thus, even when the same voltage is supplied to the first common power line 310 and the second common power line 320, the voltage drop (IR drop) may be prevented or at least reduced without the common power voltage rise (Vss rising) in comparison to the case of supplying the common power voltage through one line, to thereby minimize a luminance deterioration.

Figure 5:
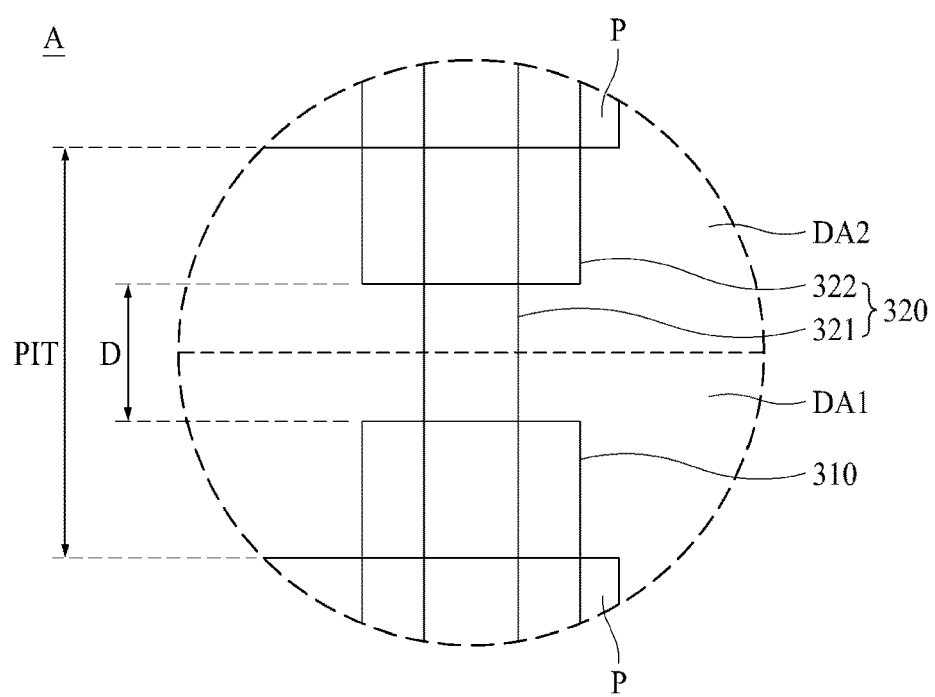
FIG. 5 is a schematic enlarged view of A portion of FIG. 3 according to one embodiment of the present disclosure.

FIG. 4 schematically illustrates the first voltage supply portion, the second voltage supply portion, a first common power line, and a second common power line of FIG. 3 according to one embodiment. FIG. 5 is a schematic enlarged view of a portion A of FIG. 3. In FIG. 4, it is shown that the first common power line 310 and the second common power line 320 are spaced apart from each other, for convenience of explanation. However, the first common power line 310 and the second common power line 320 may be disposed to overlap each other in the thickness direction of the first substrate 110, that is, in the Z-axis direction. As shown in FIG. 3, the first common power line 310 may be overlapped with the second common power line 320 in the first area DA1.

Meanwhile, in FIG. 3, the first common power line 310 is connected to the first voltage supply portion PS1, and the second common power line 320 is connected to the second voltage supply portion PS2. However, the first common power line 310 and the second common power line 320 may be connected together with the first voltage supply portion PS1, and may also be connected to the second voltage supply portion PS2. Therefore, the same common power voltage may be supplied to the first common power line 310 and the second common power line 320, or the different common power voltages may be supplied to the first common power line 310 and the second common power line 320.

Referring to FIGS. 3 and 4, at least a portion of the first common power line 310 and at least a portion of the second common power line 320 are overlapped with each other in the display area DA, and more particularly, under the pixels P adjacent to the transmission area TA so that it is possible to decrease the size (or length of the X-axis direction) of the pixel P, and thus to increase the size (or length of the X-axis direction) of the transmission area TA adjacent to the pixel P, thereby improving a transmittance. Herein, the size of pixel P may be an area excluding a light emitting area.

The display apparatus 100 according to one embodiment of the present disclosure includes the first common power line 310 connected to the first electrode 210 located in the first area DA1, and the second common power line 320 connected to the first electrode 210 located in the second area DA2 which is located further away from the first area DA1, whereby each of the first common power line 310 and the second common power line 320 individually (or separately) supplies the common power voltage to only a half of the display area DA. Thus, in comparison to the case of supplying the common power voltage to the entire display area (or common electrode) through one common power line, the display apparatus according to one embodiment of the present disclosure may prevent or at least reduce the voltage drop (IR drop) without the common power voltage rise (Vss Rising). Herein, one common power line may refer to one of a plurality of auxiliary electrodes horizontal to the data line.

Also, in the display apparatus 100 according to one embodiment of the present disclosure, each of the first common power line 310 and the second common power line 320 individually (or separately) supplies the common power voltage to only a half of the display area DA so that it is possible to prevent or at least reduce the voltage drop in each of the first common power line 310 and the second common power line 320, and to reduce the width of at least one of the first common power line 310 and the second common power line 320 (for example, the width (W1, shown in FIG. 3) of the second sub common power line 322), thereby increasing the width (W2) of the transmission area TA adjacent to the pixel P, and thus improving a transmittance.

Referring once again to FIGS. 3 and 4, the first common power line 310 and the second common power line 320 may supply the same common power voltage or different common power voltages to each of the first electrode 210 located in the first area DA1 and the first electrode 210 located in the second area DA2 from each of the first voltage supply portion PS1 and the second power supply portion PS2 provided in the pad portion.

As described above, when the different common power voltages are supplied through the first common power line 310 and the second common power line 320, a luminance non-uniformity between the first area DA1 and the second area DA2 may be prevented or at least reduced. The first common power line 310 and the second common power line 320 may be formed of a metal material to supply the common power voltage to the first electrode 210.

One side of the first common power line 310 is connected to the first voltage supply portion PS1, and the other side thereof is connected to the first electrode 210 located in the first area DA1, whereby the common power voltage supplied from the first voltage supply portion PS1 may be applied to the first electrode 210 located in the first area DA1. Herein, the other side of the first common power line 310 may be not the end of the first common power line 310, but a section of the first common power line 310 overlapped with the first area DA1.

One side of the second common power line 320 is connected to the second voltage supply portion PS2, and the other side thereof is connected to the first electrode 210 located in the second area DA2 to apply the common power voltage supplied from the second voltage supply portion PS2 to the first electrode 210 located in the second area DA2. In this case, the other side of the second common power line 320 does not mean the end of the second common power line 320, but may refer to a section of the second common power line 320 overlapped with the second area DA2.

As described above, the display apparatus 100 according to one embodiment of the present disclosure can supply the second voltage (or second common power voltage) applied by the second common power line 320 to be lower than the first voltage (or first common power voltage) applied by the first common power line 310, so that it is possible to reduce a luminance reduction of an image emitted from the second area DA2, thereby preventing or at least reducing a non-uniformity of luminance of the first area DA1 and the second area DA2.

Meanwhile, the first common power line 310 and the second common power line 320 may have different lengths. For example, the length L1 of the first common power line 310 may be shorter than the length of the second common power line 320.

As shown in FIG. 4, the first common power line 310 may be provided only to the first area DA1 in order to apply the voltage to the first electrode 210 located in the first area DA1. Therefore, the first common power line 310 may have the same length L1 as that of the first area DA1 in the Y-axis direction.

The second common power line 320 may be provided to the first area DA1 and the second area DA2 to apply the voltage to the first electrode 210 located in the second area DA2. Accordingly, the second common power line 320 may be longer than the first common power line 310.

The second common power line 320 may further include the first sub common power line 321 disposed under the first common power line 310 in the first area DA1 and overlapped with the first common power line 310 and also extended to the second area DA2, and the second sub common power line 322 contacting the first sub common power line 321 in the second area DA2 and disposed in the second area DA2.

The first sub common power line 321 may have a length L2-1 obtained by adding the length of each of the first area DA1 and the second area DA2 in the display area DA in the Y-axis direction, and one side thereof is connected to the second voltage supply portion PS2, and the other side thereof may be connected to the second sub common power line 322 in the second area DA2.

The second sub common power line 322 has a length L2-2 which is equal to or less than the length of the second area DA2 in the Y-axis direction, and the second sub common power line 322 contacts the first sub common power line 321 in the second area DA2 so as to receive the common power voltage through the first sub common power line 321.

As shown in FIG. 4, the length L2-1 of the first sub common power line 321 may be longer than the length L2-2 of the second sub common power line 322. This is because one side of the first sub common power line 321 has to be connected to the second voltage supply portion PS2 to receive the voltage from the second voltage supply portion PS2 located in the pad portion of the first non-display area NDA1. Also, the other side of the first sub common power line 321 has to be connected (or contact) to the second sub common power line 322 in the outermost pixel located in the second area DA2. Herein, the outermost pixel of the second area DA2 may refer to the first pixel adjacent to the second non-display area NDA2 among the plurality of pixels P disposed in the second area DA2. Referring to FIG. 3, the outermost pixel of the second area DA2 may be the pixel located at the uppermost portion of the display area DA.

The other side of the first sub common power line 321 contacts the second sub common power line 322 at the outermost pixel of the second area DA2. If the first sub common power line 321 and the second sub common power line 322 are in contact with each other in the intermediate pixel located adjacent to the first area DA1 in the second area DA2, a pixel resistance is generated in the contact portion, whereby the luminance is lowered toward the end of the second area DA2 (or the end of the second area DA2 adjacent to the second non-display area NDA2) in the intermediate pixel. In this case, referring to FIG. 3, the luminance is lowered from the bottom to the top in the first area DA1, and an image is displayed in such a way that its luminance is gradually lowered from a boundary with the first area DA1 to the top in the second area DA2. That is, the luminance may be provided in order of high-low-high-low level in the lower portion of the first area DA1, the upper portion of the first area DA1, the lower portion of the second area DA2, and the upper portion of the second area DA2.

However, in the display apparatus 100 according to one embodiment of the present disclosure, if the other side of the first sub common power line 321 is in contact with the second sub common power line 322 in the outermost pixel of the second area DA2, the luminance may be reduced from the end of the second area DA2 to the intermediate pixel. And, in the first area DA1, the luminance may be reduced from the pixel P adjacent to the first non-display area NDA1 to the pixel P of the first area DA1 located at the boundary between the first area DA1 and the second area DA2. That is, referring to FIG. 3, the luminance is gradually lowered from the bottom to the top in the first area DA1, and an image is displayed in such a way that its luminance is gradually lowered from the upper portion of the second area DA2 adjacent to the second non-display area NDA2 to the lower portion in the second area DA2. Accordingly, the luminance non-uniformity between the first area DA1 and the second area DA2 may be reduced since the luminance of the pixels P located at the boundary between the first area DA1 and the second area DA2 may be substantially equal.

As a result, in the display apparatus 100 according to one embodiment of the present disclosure, referring to FIG. 3, the luminance may be provided in order of high-low-low-high level in the lower portion of the first area DA1, the upper portion of the first area DA1, the lower portion of the second area DA2, and the upper portion of the second area DA2. Thus, the display apparatus 100 according to one embodiment of the present disclosure has the same or similar luminance at the boundary of the first area DA1 and the second area DA2, and thus luminance uniformity may be improved.

Meanwhile, the display apparatus 100 according to one embodiment of the present disclosure supplies the voltage to the first electrode 210 located in the first area DA1 through the first common power line 310, and supplies the voltage to the first electrode 210 located in the second area DA2 through the second common power line 320. Therefore, referring to FIGS. 3 and 4, the voltage may be supplied to the boundary portion between the first area DA1 and the second area DA2 from the lower end of the first area DA1 adjacent to the first non-display area NDA1 in the first electrode 210 provided in the first area DA1. Also, the voltage may be supplied to the boundary between the first area DA1 and the second area DA2 from the upper end of the second area DA2 adjacent to the second non-display area NDA2 in the first electrode 210 provided in the second area DA2.

As a result, as shown in FIG. 4, in the display apparatus 100 according to one embodiment of the present disclosure, the common power voltage is supplied in a first direction VD1 facing the upper end from the lower end of the first area DA1 through the first common power line 310, and the common power voltage is supplied in a second direction VD2 facing the lower end from the upper end of the second area DA2 through the second common power line 320. The first direction VD1 denotes the supply direction of the common power voltage applied to the first electrode 210 in the first area DA1, and the second direction VD2 may refer to the supply direction of the common power voltage applied to the first electrode 210 in the second area DA2.

Meanwhile, since the second sub common power line 322 which contacts the other side of the first sub common power line 321 is disposed only in the second area DA2, the second sub common power line 322 may have the length L2-2 which is shorter than the length L2-1 of the first sub common power line 321. Accordingly, the second common power line 320 may have the length obtained by summing the length L2-1 of the first sub common power line 321 and the length L2-2 of the second sub common power line 322.

Accordingly, in the display apparatus 100 according to one embodiment of the present disclosure, the length L2-2 of the second sub common power line 322 is shorter than the length L2-1 of the first sub common power line 321, and the length L1 of the first common power line 310 may be shorter than the length of the second common power line 320. Also, in the display apparatus 100 according to one embodiment of the present disclosure, the first common power line 310 supplies the voltage (or common power voltage) only to the first area DA1, the second common power line 320 supplies the voltage (or common power voltage) only to the second area DA2, and the first common power line 310 and the second common power line 320 are not in contact with each other, thereby preventing the voltage drop of the cathode voltage.

At least a portion of the first sub common power line 321 may overlap each of the first common power line 310 and the second sub common power line 322 in the thickness direction (or Z-axis direction) of the first substrate 110. More specifically, the first sub common power line 321 overlaps partially the first common power line 310 in the first area DA1, and overlaps partially the second sub common power line 322 in the second area DA2. This is to increase the area of the transmission area by reducing the width of the common power line in comparison to the case where the plurality of common power lines are not overlapped.

As shown in FIG. 4, in the display apparatus 100 according to one embodiment of the present disclosure, the first common power line 310 and the second common power line 320 having the different lengths are connected to the first electrode 210 located in the first area DA1 and the second area DA2, so that the resistance of each of the first common power line 310 and the second common power line 320 may be lowered, thereby further improving the lifespan of the first common power line 310 and the second common power line 320.

Also, in the display apparatus 100 according to one embodiment of the present disclosure, the first common power line 310 supplies the voltage only to the first area DA1, and the second common power line 320 supplies the voltage only to the second area DA2 so that it is possible to reduce the resistance of each of the first common power line 310 and the second common power line 320, and to reduce the width of the first common power line 310 and the second common power line 320, thereby improving a transmittance.

Also, since the different voltages may be applied to each of the first common power line 310 and the second common power line 320, the luminance of each of the first area DA1 and the second area DA2 may be controlled so that the luminance non-uniformity of the first area DA1 and the second area DA2 may be prevented.

Meanwhile, as shown in FIG. 4, in the display apparatus 100 according to one embodiment of the present disclosure, the voltage is applied to the central portion of the display area DA or at the boundary between the first area DA1 and the second area DA2 from the lower and upper sides with respect to the display area DA. Specifically, in the upper portion, the second voltage is supplied to the pixel P located in the second area DA2 so that it is possible to reduce a bezel width, thereby improving a degree of freedom in design.

Referring to FIG. 5, in the display apparatus 100 according to one embodiment of the present disclosure, the second sub common power line 322 and the first common power line 310 may be spaced apart from each other in the area (or at the boundary) between the first area DA1 and the second area DA2. This is to individually supply the common power voltage to each of the first electrode 210 located in the first area DA1 and the first electrode 210 located in the second area DA2.

Also, according as the second sub common power line 322 and the first common power line 310 are spaced apart from each other, the different voltages may be supplied to each of the first electrode 210 located in the first area DA1 and the first electrode 210 located in the second area DA2. In this case, the luminance uniformity between the first area DA1 and the second area DA2 may be improved.

Therefore, as shown in FIG. 5, the display apparatus 100 according to one embodiment of the present disclosure may have the structural characteristic in which the first common power line 310 and the second sub common power line 322 are spaced apart from each other at the boundary between the first area DA1 and the second area DA2.

Herein, since the first common power line 310 and the second sub common power line 322 are disposed on the same layer, the first common power line 310 and the second sub common power line 322 are spaced apart from each other at the boundary between the first area DA1 and the second area DA2. Also, the first sub common power line 321 is disposed on the different layer from those of the first common power line 310 and the second sub common power line 322, and is configured to supply the voltage only to the second area DA2, whereby the first sub common power line 321 may be not spaced apart from the boundary between the first area DA1 and the second area DA2.

In the display apparatus 100 according to one embodiment of the present disclosure, the distance D between the second sub common power line 322 and the first common power line 310 may be shorter than the pitch PIT between each of the plurality of pixels P. As shown in FIG. 5, the end of the first common power line 310 and the end of the second sub common power line 322 may be located between the pixel P and the pixel P located at the boundary between the first area DA1 and the second area DA2.

If the distance D between the second sub common power line 322 and the first common power line 310 is longer than the pitch PIT between each of the plurality of pixels P, the end of the first common power line 310 or the end of the second sub common power line 322 may be positioned in the pixel P, whereby the area of the pixel P which is not overlapped with the first common power line 310 or the second sub common power line 322 increases, and the area of the non-overlapping pixel is increased, thereby reducing the luminance. Also, if the end of the first common power line 310 or the end of the second sub common power line 322 is positioned in the pixel P, it may be recognized to a user.

Accordingly, in the display apparatus 100 according to one embodiment of the present disclosure, the distance D between the second sub common power line 322 and the first common power line 310 is shorter than the pitch PIT between each of the plurality of pixels P, and the end of the first common power line 310 and the end of the second sub common power line 322 are positioned between the pixel P and the pixel P located at the boundary between the first area DA1 and the second area DA2. Thus, the area of the pixel P which is not overlapped with the first common power line 310 or the second sub common power line 322 is not increased in size so that it is possible to prevent or at least reduce a reduction of luminance in the pixel P, and to prevent or at least reduce the end of the first common power line 310 and the end of the second sub common power line 322 from being recognized to a user in the pixel P.

Hereinafter, the structure of pixel P, transmission area TA, and contact portion CP of the display apparatus 100 according to one embodiment of the present disclosure will be described in detail with reference to FIGS. 6 and 7.

Figure 6:
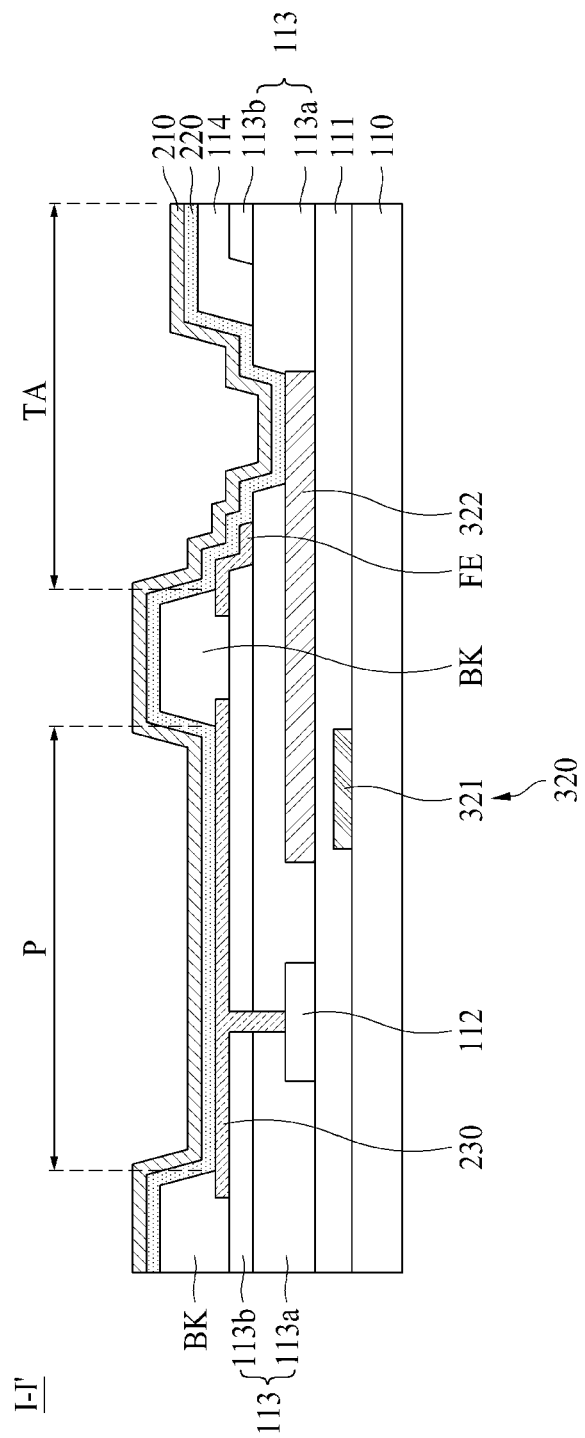
FIG. 6 is a cross sectional view along I-I' of FIG. 3 according to one embodiment of the present disclosure.

FIG. 6 is a cross sectional view along I-I' of FIG. 3 according to one embodiment. FIG. 7 is a cross sectional view along II-II' of FIG. 3 according to one embodiment. FIG. 6 illustrates the plurality of pixels P and the transmission area TA in the second area DA2, and FIG. 7 illustrates the contact portion CP provided in the transmission area TA of the second area DA2.

Referring to FIGS. 3 and 6, each of the first area DA1 and the second area DA2 may include the transmission area TA adjacent to the plurality of pixels P and transmitting light. The object or image located behind the display panel DP can be viewed through the transmission area TA. Therefore, if the area (or size) of the transmission area TA increases, the transmittance may be improved.

As shown in FIG. 6, at least one of a first planarization layer 113a, a second planarization layer 113b, or a third layer 114 may not be partially formed to increase a transmittance of the transmission area TA.

A floating electrode FE may be provided in the transmission area TA. The floating electrode FE may be configured to form an undercut structure for connecting the first electrode 210 to the second common power line 320, and connecting the first electrode 210 to the first common power line 310. According as the floating electrode FE contacts the first electrode 210, it is possible to lower the surface resistance of the first electrode 210. The detailed description thereof will be described below with reference to FIG. 7.

At least one of the first common power line 310 and the second common power line 320 may be disposed adjacent to the transmission area TA and may be overlapped with at least one of the plurality of pixels P in the thickness direction of the first substrate 110. For example, as shown in FIG. 3, the first common power line 310 and the second sub common power line 322 may be disposed to overlap the pixel P adjacent to the transmission area TA. The pixel P in which the first common power line 310 and the second sub common power line 322 are overlapped with each other may be a light emitting area, but not limited to this structure. However, the first common power line 310 and the second sub common power line 322 may be overlapped with a non-light emitting area in the pixel P, and may be overlapped with the light emitting area and the non-light emitting area. Hereinafter, the first common power line 310 and the second sub common power line 322 are overlapped with the non-light emitting area and the light emitting area in the pixel P.

Meanwhile, on assumption that the width of the first common power line 310 is W1, and the width of the transmission area TA is W2, if the width W1 of the first common power line 310 is reduced, the width of the non-light emitting area in the pixel P may be reduced, and thus the width W2 of the transmission area TA may be further increased.

As described above, in the display apparatus 100 according to one embodiment of the present disclosure, each of the first common power line 310 and the second common power line 320 supplies the voltage only to the first area DA1 and the second area DA2, which are half area of the display area DA so that it is possible to reduce the width W1 of the first common power line 310 and the second common power line 320 (for example, the width W1 of the second sub common power line 322), thereby increasing the width W2 of the transmission area TA adjacent to the pixel P, and thus improving the transmittance.

In the display apparatus 100 according to one embodiment of the present disclosure, the transmission area TA may include the contact portion CP. The first common power line 310 and the first electrode 210 may be connected in the contact portion CP provided in the first area DA1, and the second sub common power line 322 of the second common power line 320 and the first electrode 210 may be connected in the contact portion CP provided in the second area DA2. Therefore, it is possible to reduce the voltage drop in the first electrode 210 located in the first area DA1 and the first electrode 210 located in the second area DA2 by the voltage (or common power voltage) supplied through the first common power line 310 and the second common power line 320, and it is possible to realize the luminance uniformity of the image displayed on the first area DA1 and the second area DA2 in accordance with the level of the voltage (or common power voltage) supplied through the first common power line 310 and the second common power line 320.

Meanwhile, the reason why the contact portion CP is provided in the transmission area TA is to make the contact portion CP be spaced apart from the pixel P. In this case, if moisture is permeated into the organic light emitting layer 220 provided in the contact portion CP, it is possible to block or at least reduce the moisture permeated into the organic light emitting layer 220 located in the pixel P or to enlarge a moisture permeability path, to thereby prevent or reduce damage to the organic light emitting layer 220 disposed in the pixel P due to moisture.

The structure of the contact portion CP included in the transmission area TA will be described after the structure of the pixel P.

Referring to FIGS. 3 and 6, the first sub common power line 321 is formed on one surface of the first substrate 110. The first sub common power line 321 may be connected to the second voltage supply portion PS2 and may be applied with the common power voltage.

The first layer 111 is formed to cover the first sub common power line 321. The first layer 111 may be an insulating layer.

The thin film transistor 112 and the second sub common power line 322 may be formed on the first layer 111. As shown in FIG. 6, the thin film transistor 112 and the second sub common power line 322 may be spaced apart from each other.

Meanwhile, a buffer film (not shown) may be provided between the first substrate 110 and the first layer 111 so as to protect the thin film transistor 112, which is vulnerable to moisture, from moisture permeating through the first substrate 110.

Each of the thin film transistors 112 includes an active layer, a gate electrode, a source electrode, and a drain electrode. The thin film transistor 112 may be formed in a bottom gate type in which a gate electrode is located at a lower portion of an active layer, or a double gate type in which a gate electrode is located at both upper and lower portions of an active layer.

The second sub common power line 322 is connected to the first sub common power line 321 at the outermost pixel P positioned at the end of the second area DA2, thereby receiving the common power voltage from the first sub common power line 321. As shown in FIGS. 6 and 7, the second sub common power line 322 may be disposed to be overlapped partially with the second electrode 230 in the pixel P, whereby the second sub common power line 322 may extend from the pixel P to the contact portion CP included in the transmission area TA.

Referring once again to FIG. 6, the second layer 113 may be formed to cover the thin film transistor 112 and the second sub common power line 322. The second layer 113 may include a first planarization layer 113a for flattening a step difference caused by the thin film transistor 112, and a second planarization layer 113b disposed on an upper surface of the first planarization layer 113a. The first planarization layer 113a and the second planarization layer 113b may not be partially formed in the transmission area TA to improve the transmittance of the transmission area TA.

A light emitting device and a bank BK are formed on the second layer 113. The light emitting device includes the first electrode 210, the organic light emitting layer 220, and the second electrode 230. The first electrode 210 may be a cathode electrode that is a common electrode, and the second electrode 230 may be an anode electrode. The area where the first electrode 210, the organic light emitting layer 220, and the second electrode 230 are stacked may be defined as the light emitting area (or a light emitting portion).

The second electrode 230 may be formed on the second layer 113. The second electrode 230 is connected to the drain electrode or the source electrode of the thin film transistor 112 through a contact hole passing through the first planarization layer 113a and the second planarization layer 113b.

The second electrode 230 may be formed of at least one of a transparent metal material, a semi-transparent metal material, or a metal material having a high reflectance.

When the display apparatus 100 is formed in the top emission type, the second electrode 230 may be formed of a metal material having a high reflectance, or may be formed in a stacked structure of a metal material having a high reflectance and a transparent metal material. For example, the second electrode 230 may be formed of a metal material having a high reflectance, for example, a deposition structure of aluminum and titanium (Ti/Al/Ti), a deposition structure of aluminum and indium tin oxide (ITO/Al/ITO), Ag alloy, and a deposition structure of Ag alloy and ITO (ITO/Ag alloy/ITO). Herein, the Ag alloy may be an alloy such as silver (Ag), palladium (Pd), and copper (Cu).

When the display apparatus 100 is formed in the bottom emission type, the second electrode 230 may be formed of a transparent conductive material capable of transmitting light, for example, ITO or IZO, or a semi-transmissive conductive material such as magnesium (Mg), silver (Ag), or an alloy of magnesium (Mg) and silver (Ag).

Meanwhile, the material forming the second electrode 230 may include MoTi. The second electrode 230 may be an anode electrode.

The bank BK corresponds to the non-light emitting area in which light is not emitted, and the bank BK may be configured to surround each light emitting area (or light emitting portion) in the plurality of pixels P. That is, the bank BK may divide (or define) each light emitting area (or light emitting portion).

The bank BK is formed to cover the edge of the second electrode 230 on the second layer 113, thereby dividing (or defining) the light emitting area (or light emitting portion) in the plurality of pixels P.

The bank BK may be formed to cover the edge of each of the second electrodes 230 in the pixels P, and may be configured to expose a part of each of the second electrodes 230. Accordingly, a current is concentrated at the end of each of the second electrodes 230, to prevent a problem related with a degradation of light emitting efficiency. An exposed portion of the second electrode 230 which is not covered by the bank BK may be the light emitting area (or light emitting portion).

The bank BK may be formed of an organic layer of acrylic resin, epoxy resin, phenolic resin, polyamide resin, or polyimide resin.

The organic light emitting layer 220 is formed on the second electrode 230 and the bank BK. When the voltage is applied to the second electrode 230 and the first electrode 210, holes and electrons move to the organic light emitting layer 220, respectively, and are combined with each other in the organic light emitting layer 220 so as to emit light.

The organic light emitting layer 220 may have the different luminance depending on the voltage difference formed between the first electrode 210 and the second electrode 230. For example, if the voltage difference formed between the first electrode 210 and the second electrode 230 is large, the luminance is increase. Meanwhile, if the voltage difference formed between the first electrode 210 and the second electrode 230 is small, the luminance may be lowered.

The display apparatus 100 according to one embodiment of the present disclosure applies the first common power voltage to the first electrode 210 located in the first area DA1 through the first common power line 310, and applies the second common power voltage, which is different from the first common power voltage, to the first electrode 210 located in the second area DA2 through the second common power line 320 so that it is possible to adjust the luminance difference between the organic light emitting layer 220 located in the first area DA1 and the organic light emitting layer 220 located in the second area DA2.

The organic light emitting layer 220 may be formed as the common layer provided on the plurality of pixels P and the bank BK. In this case, the organic light emitting layer 220 may have a tandem structure in which the plurality of light emitting layers, for example, a yellow green light emitting layer and a blue light emitting layer are stacked, and may emit white light when an electric field is formed between the second electrode 230 and the first electrode 210. In this case, a color filter (not shown) corresponding to a color of the corresponding pixel may be formed on the second substrate 120. For example, a red color filter may be provided in the red pixel, a green color filter may be provided in the green pixel, and a blue color filter may be provided in the blue pixel. Since the organic light emitting layer 220 emits white light, a color filter may not be provided in the white pixel.

However, the organic light emitting layer 220 may include a red light emitting layer for emitting red light in the first pixel, a green light emitting layer for emitting green light in the second pixel, a blue light emitting layer for emitting blue light from the third pixel, and a white light emitting layer for emitting white light in the fourth pixel. In this case, since the organic light emitting layer 220 is provided to emit the different colors for the respective pixels P, the color filter may not be formed on the second substrate 120.

The first electrode 210 is formed on the organic light emitting layer 220. The first electrode 210 may be the common layer commonly formed on the pixels P. The first electrode 210 may be formed of a transparent metal material, a semi-transparent metal material, or a metal material having a high reflectance.

If the display apparatus 100 is formed in the top emission type, the first electrode 210 may be formed of a transparent conductive material capable of transmitting light, for example, ITO or IZO, or a semi-transmissive conductive material such as magnesium (Mg), silver (Ag), or an alloy of magnesium (Mg) and silver (Ag).

If the display apparatus 100 is formed in the bottom emission type, the first electrode 210 may be formed of a metal material having a high reflectance, for example, a deposition structure of aluminum and titanium (Ti/Al/Ti), a deposition structure of aluminum and indium tin oxide (ITO/Al/ITO), Ag alloy, and a deposition structure of Ag alloy and ITO (ITO/Ag alloy/ITO). Herein, the Ag alloy may be an alloy such as silver (Ag), palladium (Pd), and copper (Cu). The first electrode 210 may be a cathode electrode.

A capping layer may be formed on the first electrode 210, but may be omitted. The first electrode 210 may be connected to each of the first common power line 310 and the second common power line 320 in the contact portion CP, and may be applied with the cathode voltage (or common power voltage). The first electrode 210 may receive the same voltage or the different voltages from each of the first common power line 310 and the second common power line 320 connected to the first voltage supply portion PS1 and the second voltage supply portion PS2, respectively.

Hereinafter, the contact portion CP provided in the transmission area TA will be described in detail with reference to FIG. 7.

Figure 7:
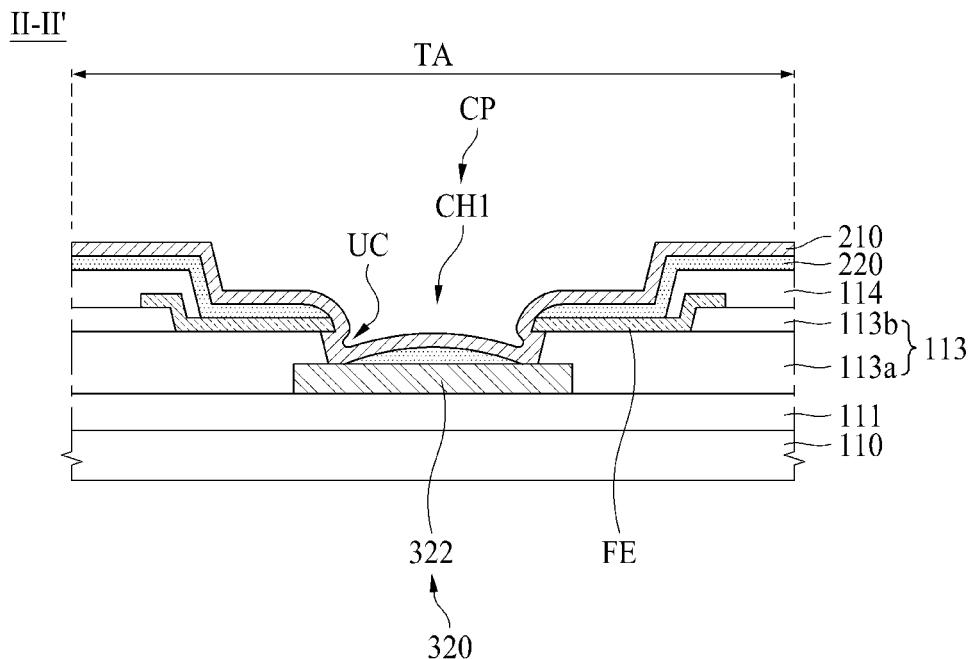
FIG. 7 is a cross sectional view along II-II' of FIG. 3 according to one embodiment of the present disclosure.

Referring to FIG. 7, the contact portion CP may include a first layer 111, a second layer 113, a third layer 114, a first contact hole CH1, and a floating electrode FE. The second sub common power line 322 extends from the pixel P to the contact portion CP, whereby the second sub common power line 322 may contact the first electrode 210 in the first contact hole CH1. Since the first layer 111 and the second layer 113 has been already described in the above explanation related with the pixel structure P, a detailed description thereof will be omitted.

The floating electrode FE may be in contact with the first electrode 210, to thereby reduce the surface resistance of the first electrode 210. As shown in FIG. 7, a portion of the floating electrode FE may be disposed on an upper surface of the first planarization layer 113a, and may extend from a portion of the floating electrode FE to an upper surface of the second planarization layer 113b. A portion of the floating electrode FE disposed on the upper surface of the first planarization layer 113a may be exposed to the first contact hole CH1, and then may be in contact with the first electrode 210 formed in a subsequent process. Accordingly, the floating electrode FE may reduce the surface resistance of the first electrode 210.

The floating electrode FE may be formed of the same material as the second electrode 230 by the same process. Accordingly, the floating electrode FE may be disposed in the same layer as the second electrode 230. For example, the floating electrode FE may be disposed on an upper surface of the second layer 113.

As shown in FIG. 7, the edge of the floating electrode FE may be covered by the third layer 114. The third layer 114 may be formed later than the floating electrode FE, whereby the third layer 114 may cover the edge of the floating electrode FE, and the third layer 114 may be formed of the same material as the bank BK by the same process. Since the floating electrode FE is connected to the first electrode 210, the current may be concentrated at the end of the floating electrode FE. And, according as the third layer 114 covers the end of the floating electrode FE, it is possible to prevent defects caused by the current concentration.

The first contact hole CH1 may be formed by patterning a portion of each of the third layer 114, the second layer 113, and the floating electrode FE provided in the transmission area TA. Accordingly, the upper surface of the second sub common power line 322 may be exposed in the first contact hole CH1, but not limited to this structure. The first contact hole CH1 may be formed by patterning a portion of the second layer 113, making a portion of the floating electrode FE protruding toward the center of the first contact hole CH1 than the inclined surface of the first planarization layer 113a, and patterning a portion of the third layer 114.

Meanwhile, a portion of the floating electrode FE disposed on the upper surface of the first planarization layer 113a may protrude further toward the center of the first contact hole CH1 than the inclined surface (or side surface) of the first planarization layer 113a. Accordingly, due to a portion of the floating electrode FE that protrudes further than the inclined surface of the first planarization layer 113a, the organic light emitting layer 220 formed after the second electrode 230 may not completely cover the entire upper surface of the second sub common power line 322 exposed by the first contact hole CH1. That is, an undercut structure UC may be formed by a portion of the protruding floating electrode FE. Thus, as shown in FIG. 7, the organic light emitting layer 220 may cover only a portion of the upper surface of the second sub common power line 322 exposed in the first contact hole CH1, and the first electrode 210 corresponding to the common layer may contact a portion (or upper surface) of the second sub common power line 322 in the undercut structure UC which is not covered by the organic light emitting layer 220 in the first contact hole CH1. Therefore, since the first electrode 210 and the second sub common power line 322 may be in contact through the first contact hole CH1 provided in the transmission area TA, the first electrode 210 located in the second area DA2 may receive the common power voltage supplied from the second voltage supply portion PS2, to thereby prevent the voltage drop.

FIG. 7 shows the contact portion CP provided in the second area DA2. However, this structure may be identically applied to the contact portion CP provided in the first area DA1. In the contact portion CP of the first area DA1, instead of the second sub common power line 322, the first common power line 310 may be in contact with the first electrode 210 located in the first area DA1. Therefore, the first electrode 210 located in the first area DA1 may receive the common power voltage supplied from the first voltage supply portion PS1 through the first common power line 310, thereby preventing or at least reducing the voltage drop.

Meanwhile, the display apparatus 100 according to one embodiment of the present disclosure may be provided to apply the different common power voltages to the first electrode 210 located in the first area DA1 and the first electrode 210 located in the second area DA2 in order to reduce the luminance deviation of the image displayed in each of the first area DA1 and the second area DA2.

The contact portion CP having the first contact hole CH1 may be provided by each unit pixel UP, but not limited to this structure. For example, one contact portion CP having the first contact hole CH1 may be provided for the plurality of unit pixels UP, for example, two or more unit pixels UP.

Figure 8:
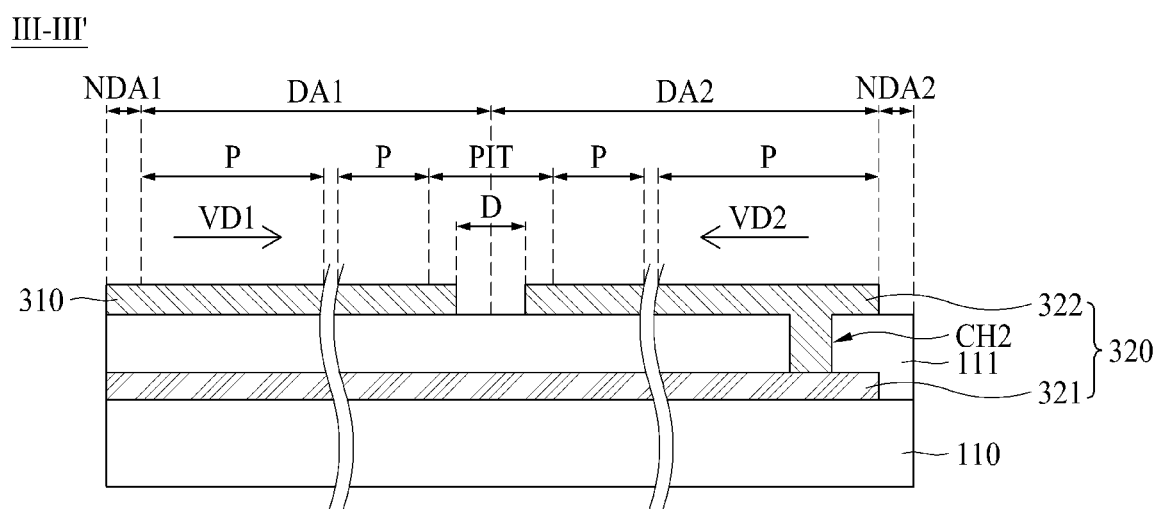
FIG. 8 schematically illustrates a first common power line and a second common power line in the cross sectional view along II-II' of FIG. 3 according to one embodiment of the present disclosure.

FIG. 8 is a cross sectional view along III-III' of FIG. 3, which schematically illustrates the first common power line and the second common power line according to one embodiment.

Referring to FIGS. 3 and 8, the first sub common power line 321 may extend from the first area DA1 to the second area DA2 along the Y-axis direction on the upper surface of the first substrate 110. The first layer 111 may be an insulating layer, and may cover the first sub common power line 321. The first common power line 310 may be formed on an upper surface of the first layer 111. Accordingly, the first sub common power line 321 and the first common power line 310 may be disposed on the different layers to be insulated from each other.

Also, since the first sub common power line 321 and the first common power line 310 are not in contact with each other in the first area DA1, the common power voltage supplied from the second voltage supply portion PS2 is not lowered, and is applied to the second sub common power line 322 disposed in the second area DA2.

The second sub common power line 322 may be disposed on an upper surface of the first layer 111. That is, the second sub common power line 322 may be disposed on the same layer as the first common power line 310. Herein, the first common power line 310 may be overlapped partially with the pixels P located in the first area DA1. The second sub common power line 322 may overlap partially the pixels P located in the second area DA2. The first common power line 310 supplies the common power voltage to the first electrode 210 located in the first area DA1, and the second common power line 320 supplies the common power voltage to the first electrode 210 located in the second area DA2.

On the other hand, in the display apparatus 100 according to one embodiment of the present disclosure, the first common power line 310 and the second sub common power line 322 may be spaced apart from each other at the boundary between the first area DA1 and the second area DA2, respectively, to supply the same common power voltage or the different common power voltages to the first electrodes 210 located in the first area DA1 and the first electrodes 210 located in the second area DA2. Therefore, as shown in FIG. 8, the first common power line 310 and the second sub common power line 322 may be spaced apart by a predetermined distance D at the boundary between the first area DA1 and the second area DA2. This distance D may be shorter than the pitch PIT between each of the plurality of pixels P.

Also, in the display apparatus 100 according to one embodiment of the present disclosure, since the end of the first common power line 310 and the end of the second sub common power line 322 are disposed between each of the plurality of pixels P at the boundary between the first area DA1 and the second area DA2, the separated portions of the first common power line 310 and the second sub common power line 322 may not be recognized to a user.

Referring once again to FIG. 8, a second contact hole CH2 may be formed in the outermost pixel P of the second area DA2 adjacent to the second non-display area NDA2. The second contact hole CH 2 is configured to contact the second sub common power line 322 with the first sub common power line 321, and may be patterned to pass through the first layer 111 before forming the second sub common power line 322.

Therefore, the second sub common power line 322 may contact the first sub common power line 321 through the second contact hole CH 2 formed in the outermost pixel P of the second area DA2 so that the second voltage supplied from the second voltage supply portion PS2 may be applied through the first sub common power line 321.

Thus, as shown in FIG. 8, in the display apparatus 100 according to one embodiment of the present disclosure, the common power voltage is applied in the first direction VD1 through the first common power line 310 in the first area DA1, and the common power voltage is applied in the second direction VD2 through the second common power line 320 in the second area DA2. Herein, the second common power line 320 may be disposed on the same layer as the first common power line 310, and may be the second sub common power line 322 disposed on an upper surface of the first layer 111.

Meanwhile, the reason why the second contact hole CH2 is disposed in the outermost pixel P of the second area DA2 is that the luminance is gradually lowered from the lower portion to the upper portion in the first area DA1, as shown in FIG. 3, and an image is displayed in such a way that its luminance is gradually lowered from the upper portion to the lower portion in the second area DA2, whereby the luminance of the pixels P located at the boundary between the first area DA1 and the second area DA2 may be substantially equal.

As a result, in the display apparatus 100 according to one embodiment of the present disclosure, referring to FIG. 3, the luminance may be provided in order of high-low-low-high level in the lower portion of the first area DA1, the upper portion of the first area DA1, the lower portion of the second area DA2, and the upper portion of the second area DA2. Thus, the luminance deviation between the first area DA1 and the second area DA2 is reduced, and thus luminance uniformity may be improved.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure. It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. A display apparatus comprising:
a substrate including a display area having a first area and a second area;
a first electrode disposed provided in the first area and the second area;
a first common power line disposed between the substrate and the first electrode, the first common power line connected to the first electrode provided in the first area; and
a second common power line disposed between the substrate and the first electrode and connected to the first electrode provided in the second area through the first area,
wherein the first common power line overlaps a portion of the second common power line in a direction toward the substrate without contacting the portion of the second common power line,
wherein the second common power line includes:
a first sub common power line provided on a different layer from that of the first common power line; and
a second sub common power line electrically connected with the first sub common power line and provided on a same layer as the first common power line,
wherein the second sub common power line and the first common power line are spaced apart from each other at a boundary between the first area and the second area,
wherein each of the first area and the second area includes a plurality of pixels configured to emit light,
wherein each of the first area and the second area further includes a transmission area disposed adjacent to the plurality of pixels, the transmission area configured to transmit light therethrough,
wherein the transmission area includes a contact portion where the first electrode located in the first area is connected with the first common power line and the first electrode located in the second area is connected with the second common power line,
wherein the contact portion includes:
a first layer disposed on the substrate, the first layer configured to cover the first sub common power line;
a second layer configured to cover the second sub common power line disposed on the first layer;
a floating electrode disposed on the second layer, the floating electrode electrically separated from a second electrode in each of the plurality of pixels;
a third layer configured to cover an edge of the floating electrode; and
a first contact hole patterned from the third layer, the second layer, and the floating electrode, the first contact hole configured to expose a portion of the second sub common power line,
wherein the first electrode contacts a portion of the second sub common power line exposed via the first contact hole.

2. The display apparatus according to claim 1, wherein the first common power line is disposed on a different layer from that of the second common power line in the first area.

3. The display apparatus according to claim 1,
wherein the first common power line is spaced apart from the second common power line.

4. The display apparatus according to claim 1, wherein a length of the first common power line is shorter than a length of the second common power line.

5. The display apparatus according to claim 1,
wherein the first common power line is a single wire, and the second common power line is a double wire provided on different layers and electrically connected to each other.

6. The display apparatus according to claim 1, wherein the first common power line and the second common power line are supplied with different voltages.

7. The display apparatus according to claim 1, wherein at least a portion of the first sub common power line is overlapped with each of the first common power line and the second sub common power line in a thickness direction of the substrate.

8. The display apparatus according to claim 1, wherein a length of the second sub common power line is shorter than a length of the first sub common power line.

9. The display apparatus according to claim 1, wherein
a distance between the second sub common power line and the first common power line is shorter than a pitch between each of the plurality of pixels.

10. The display apparatus according to claim 1,
wherein
at least one of the first common power line and the second common power line is disposed adjacent to the transmission area and overlapped with at least one among the plurality of pixels in a thickness direction of the substrate.

11. The display apparatus according to claim 1, wherein each of the plurality of pixels includes:
a thin film transistor provided on the first layer, the thin film transistor covered by the second layer; and
an organic light emitting layer disposed on the second electrode which is electrically connected with the thin film transistor and disposed on the second layer,
wherein the first electrode covers the organic light emitting layer.

12. The display apparatus according to claim 1, wherein the second sub common power line is connected to the first sub common power line via a second contact hole penetrating through the first layer.

13. A display apparatus comprising:
a substrate including a display area having a first area and a second area, wherein each of the first area and the second area includes a transmission area;
a first electrode provided in the first area and the second area;
a first common power line extending to the first area without extending to the second area, the first common power line connected with the first electrode provided in the first area; and
a second common power line extending to the first area and the second area, the second common power line connected with the first electrode provided in the second area,
wherein a length of the first common power line is different from a length of the second common power line,
wherein the second common power line includes:
a first sub common power line provided on a different layer from that of the first common power line; and
a second sub common power line electrically connected with the first sub common power line and provided on a same layer as the first common power line,
wherein the second sub common power line and the first common power line are spaced apart from each other at a boundary between the first area and the second area,
wherein each of the first area and the second area includes a plurality of pixels configured to emit light,
wherein each of the first area and the second area further includes a transmission area disposed adjacent to the plurality of pixels, the transmission area configured to transmit light therethrough,
wherein the transmission area includes a contact portion where the first electrode located in the first area is connected with the first common power line and the first electrode located in the second area is connected with the second common power line,
wherein the contact portion includes:
a first layer disposed on the substrate, the first layer configured to cover the first sub common power line;
a second layer configured to cover the second sub common power line disposed on the first layer;
a floating electrode disposed on the second layer, the floating electrode electrically separated from a second electrode in each of the plurality of pixels;
a third layer configured to cover an edge of the floating electrode; and
a first contact hole patterned from the third layer, the second layer, and the floating electrode, the first contact hole configured to expose a portion of the second sub common power line,
wherein the first electrode contacts a portion of the second sub common power line exposed via the first contact hole.

14. The display apparatus according to claim 13, further comprising a pad portion disposed at one edge of the substrate, the pad portion connected with each of the first common power line and the second common power line,
wherein each of the first common power line and the second common power line has a different length from the pad portion.

15. The display apparatus according to claim 13, wherein the first common power line and the second common power line are overlapped with each other in the first area.

16. The display apparatus according to claim 13,
wherein the substrate further includes a non-display area having a first non-display area and a second non-display area provided to surround the display area and disposed symmetrically with respect to the display area;
a first voltage supply portion connected with the first common power line in the first non-display area; and
a second voltage supply portion spaced apart from the first voltage supply portion and connected with the second common power line in the first non-display area.

17. The display apparatus according to claim 16,
wherein a voltage is supplied to a boundary portion between the first area and the second area from a lower end of the first area adjacent to the first non-display area in the first electrode provided in the first area, and
a voltage is supplied to the boundary portion between the first area and the second area from an upper end of the second area adjacent to the second non-display area in the first electrode provided in the second area.

18. The display apparatus according to claim 16, wherein the second voltage supply portion supplies a voltage which is less than that of the first voltage supply portion.

19. The display apparatus according to claim 16,
wherein the second sub common power line is connected with the first sub common power line in an outermost pixel adjacent to the second non-display area among a plurality of pixels disposed in the second area.

20. The display apparatus according to claim 13, wherein the first electrode is a cathode electrode.

* * * * *